United States Patent [19]
Dydyk et al.

[11] Patent Number: 5,124,674
[45] Date of Patent: Jun. 23, 1992

[54] LUMPED ELEMENT DIRECTIONAL FILTER

[75] Inventors: Michael Dydyk, Scottsdale; Vijay Nair, Mesa, both of Ariz.

[73] Assignee: Motorola, Inc., Schaumburg, Ill.

[21] Appl. No.: 663,997

[22] Filed: Mar. 4, 1991

[51] Int. Cl.$^5$ .............................................. H03H 7/01
[52] U.S. Cl. ..................................... 333/110; 333/112; 333/132
[58] Field of Search ............... 333/110, 112, 118, 129, 333/132

[56] References Cited

U.S. PATENT DOCUMENTS 2,942,209  6/1960  Cohn ................................. 333/110
3,781,718 12/1973  Gittinger ............................ 333/118

Primary Examiner—Paul Gensler
Attorney, Agent, or Firm—Robert D. Atkins

[57] ABSTRACT

A directional filter is provided implemented with passive lumped elements in several embodiments from a general 18-element network, to an intermediate ten-element embodiment and a simple two-element filter each with features and advantages depending on the application. In general, a directional filter with lumped elements requires less physical area with similar performance characteristics as conventional transmission lines which is desirable in technologies such as MMIC.

8 Claims, 6 Drawing Sheets

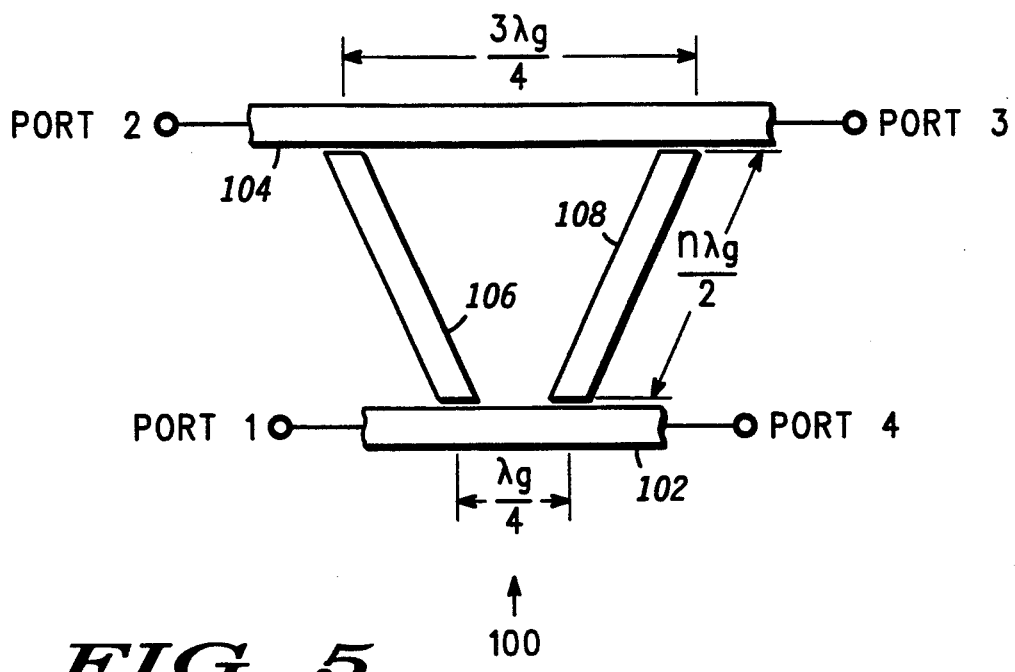
FIG. 5
—PRIOR ART—
FIG. 6A
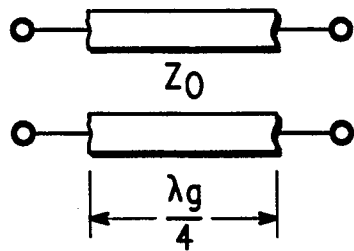
FIG. 6B
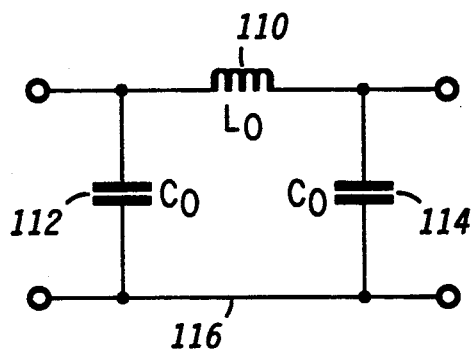
FIG. 7A
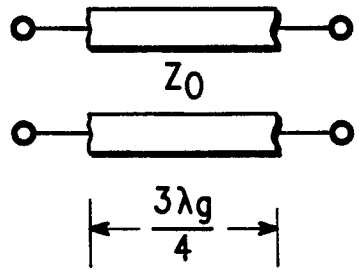
FIG. 7B
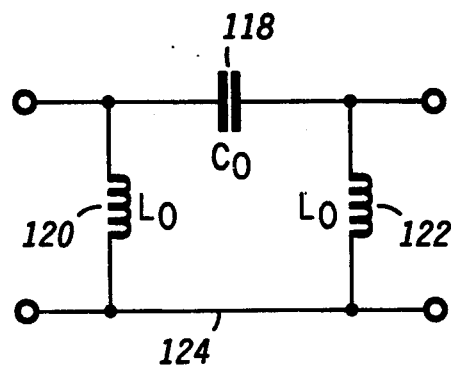

LUMPED ELEMENT DIRECTIONAL FILTER

FIELD OF THE INVENTION

This invention relates in general to filters, and more particularly, to a directional filter implemented with lumped elements.

BACKGROUND OF THE INVENTION

There are many types of directional filters, for example, as disclosed in U.S. Pat. Nos. 2,922,123 entitled "Directional Filters for Strip-line Transmission Systems"; 3,447,102 entitled "Microwave Frequency Converting Comprising Multi-port Directional Couplers"; and 4,287,605 entitled "Directional Filter for Mixers, Converter and the Like", which are generally indicative of the state of the art. The directional filters in most, if not all, prior art systems including those mentioned above use strip-line transmission lines in close proximity to achieve the RF-to-LO frequency isolation while suppressing undesired frequencies. Unfortunately, transmission line-type directional couplers tend to require large physical areas and large coupling coefficients to minimize conversion loss which demands more LO (Local Oscillator) power. For example, a 10 dB directional coupler will increase the required LO power ten fold. The excessive power consumption and space requirements are undesirable especially in applications using MMIC (Monolithic Microwave Integrated Circuit) technology.

Hence, there is a need for an improved directional filter implemented without transmission lines and of appropriate physical size for use in MMIC technology.

SUMMARY OF THE INVENTION

Briefly stated, the invention comprises a directional filter comprising a first lumped element coupled between a first port and a fourth port, and a second lumped element coupled between a second port and a third port for providing isolation between the first port and the fourth port. The first port is coupled to the second port, and the third port is coupled to the fourth port.

In another aspect the present invention is a directional filter comprising a first lumped element network coupled between a first port and a fourth port, and a second lumped element network coupled between a second port and a third port. A third lumped element network is coupled between the first port and the second port, and a fourth lumped element network is coupled between the third port and the fourth port for providing isolation between the first port and the fourth port.

Thus, one advantage of the present invention is the option of several embodiments of a directional filter with passive lumped elements having the isolation properties of conventional directional filters, but with the capability of miniaturization to MMIC devices unlike conventional directional filters using transmission lines.

BRIEF DESCRIPTION OF THE DRAWING

FIG. 5 is a block diagram illustrating a conventional distributed directional filter using transmission lines;

FIGS. 6a and 6b are block and schematic diagrams illustrating a conversion between one-quarter wavelength distributed and lumped element representations;

FIGS. 7a and 7b are block and schematic diagrams illustrating another conversion between three-quarter wavelength distributed and lumped element representations;

DETAILED DESCRIPTION OF THE PRIOR ART

Figure 1:
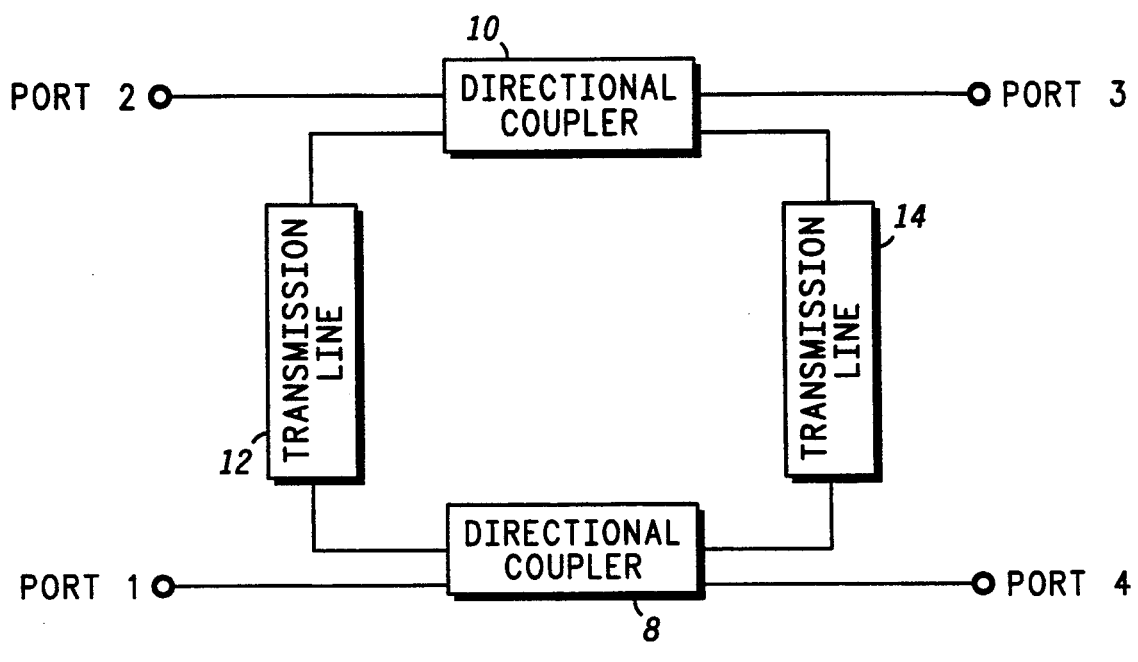
FIG. 1 is a block diagram illustrating a conventional distributed directional filter.

A classic four-port directional filter 6 is illustrated in FIG. 1 as two interconnected directional couplers 8 and 10 which may be realized by strip-line transmission lines in close proximity to one another with interconnecting single transmission lines 12 and 14 having a combined length of one full wavelength of the center frequency of the filter. Transmission lines 12 and 14 may be arranged parallel to one another and perpendicular to directional couplers 8 and 10. The operation of directional filter 6 may best be understood by way of example. Assume port 1 of directional filter 6 is excited by an input signal having frequency components $f_1 + f_2 + f_3$. If directional couplers 8 and 10 and interconnecting transmission lines 12 and 14 having the same wavelength as signal frequency component $f_2$, say 900 Megahertz, then the same signal frequency $f_2$ is rejected from the forward propagation path (port 1 to port 4) and appears at port 2 while the remaining components $f_1 + f_3$ of the incident signal appear at port 4. Thus, directional filter 6 provides both band pass (port 1 to port 2) and band reject (port 1 to port 4) functions. Port 1 and port 3 remain isolated over the entire frequency band.

Figure 2:
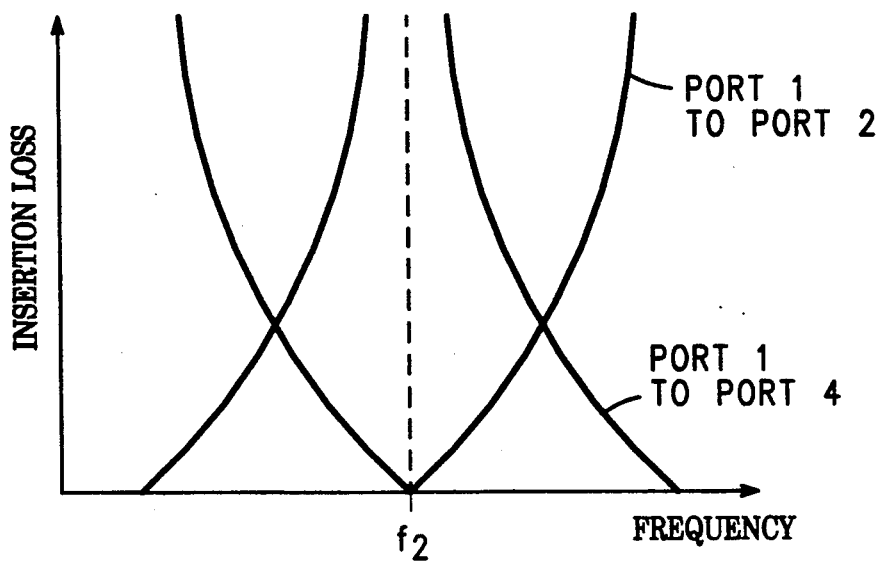
FIG. 2 is a frequency response curve of a directional filter.

The frequency response shown in FIG. 2 is a graphic illustration of the operation of directional filter 6 wherein the insertion loss between port 1 and port 4 is maximum at frequency $f_2$, while the insertion loss between port 1 and port 2 is minimum. That is, the frequency component $f_2$ of the input signal is rejected from port 4 and transferred from port 1 to port 2 without insertion loss for the ideal case given any degree of directional coupling coefficients. An important feature of the directional filter 6 lies in the loss compensation of the interconnecting transmission lines 12 and 14 via adjustment of coupling coefficients of the directional couplers 8 and 10 allowing individual settings of the coupling coefficients. Further detail of directional filter 6 is disclosed in U.S. Pat. No. 2,922,123 referenced above.

Common applications of directional filter 6 include single ended and image rejection, image enhancement mixers as described in U.S. Pat. Nos. 4,287,605 and 4,457,022, and channelized receivers where it is essential to separate the incoming signal from the carrier before processing. In a typical application as an RF (Radio Frequency) to IF (Intermediate Frequency)

mixer, an RF input signal is applied at port 1 of directional filter 6 while a LO (Local Oscillator) input signal is applied at port 3 for developing an IF (Intermediate Frequency) output signal at port 2. Port 4 is unused and therefore terminated with a characteristic impedance $Z_0$. Directional coupler 10 is typically 10 dB which means one tenth of the LO power is transferred to port 4. Therefore, the LO input signal power must be 10 times the RF input signal power. It is desirable to reduce the considerable power losses in the directional filter. In addition, the transmission line embodiment of directional filter 6 is not conducive to miniaturization for applications using MMIC technology.

DETAILED DESCRIPTION OF THE PREFERRED EMBODIMENT

Figure 3:
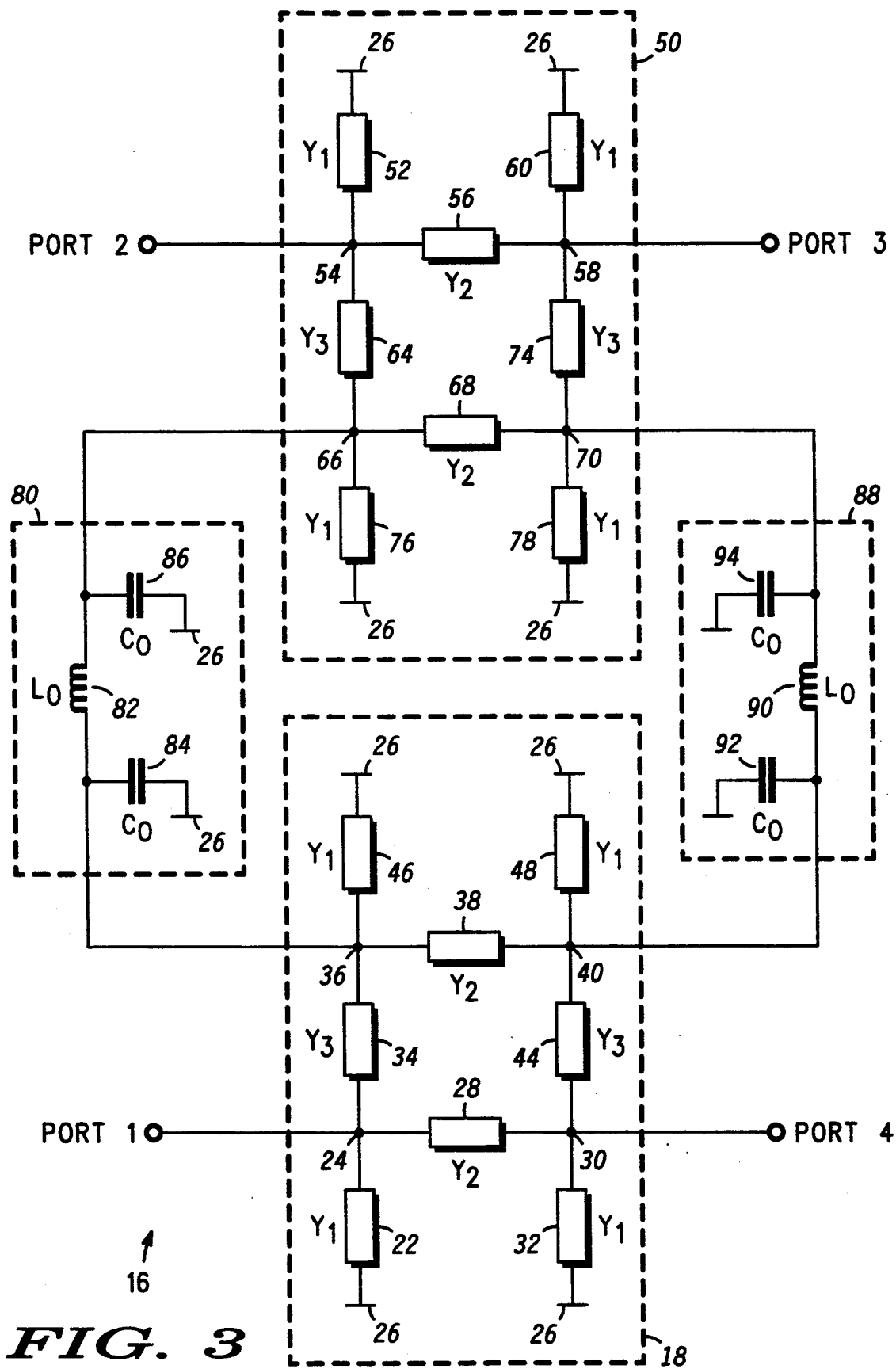
FIG. 3 is a schematic diagram illustrating a general four-port lumped element directional filter.
Figure 4A:
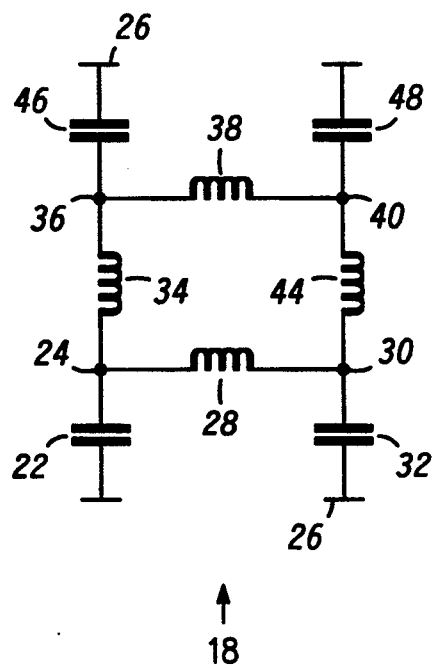
FIGS. 4a, 4b, 4c and 4d illustrate four specific embodiments of the lumped element directional coupler.
Figure 4B:
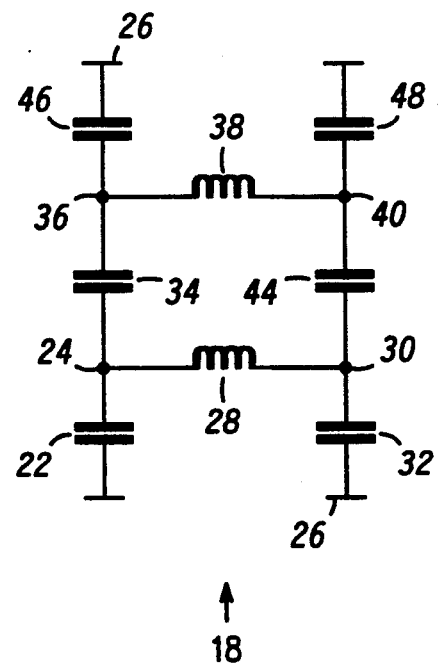
Figure 4C:
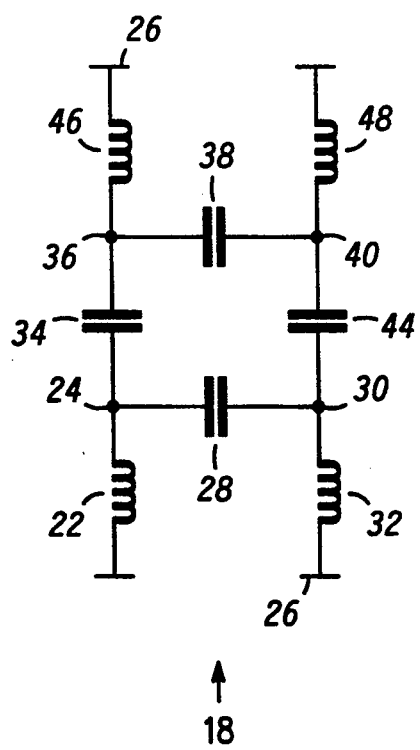
Figure 4D:
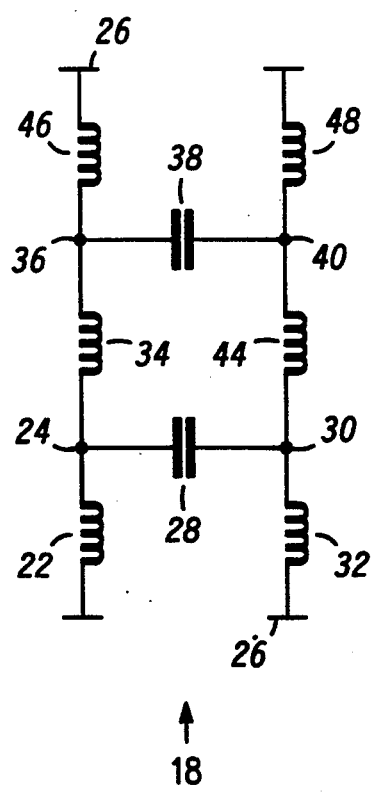

As part of the present invention, directional couplers 8 and 10 and transmission lines 12 and 14 of FIG. 1 may be generally realized as directional filter 16 with lumped elements as shown in FIG. 3. It is important to recognize that the lumped element representation may be derived in a one-to-one correspondence with each component of the filter structure of FIG. 1. For example, lumped element network 18 (corresponding to directional coupler 8 of FIG. 1) is shown in FIG. 3 including admittance element 22 with value $Y_1$ coupled between port 1 at node 24 and power supply conductor 26 typically operating at ground potential. Admittance element 28 of value $Y_2$ is coupled between node 24 and node 30 while admittance element 32 of value $Y_1$ is coupled between node 30 and power supply conductor 26. Lumped element network 18 further includes admittance element 34 of value $Y_3$ coupled between node 24 and node 36, admittance element 38 of value $Y_2$ coupled between node 36 and node 40 and admittance element 44 of value $Y_3$ coupled between node 40 and node 30 at port 4. Admittance element 46 of values $Y_1$ is coupled between node 36 and power supply conductor 26, and admittance element 48 also of values $Y_1$ is coupled between node 40 and power supply conductor 26.

It is possible to generate several specific embodiments from lumped element network 18. In general, the following explicit set of synthesis equations must be simultaneously satisfied at the frequency of operation:

$$Y_1 + Y_2 + Y_3 = 0 \tag{1}$$

$$Y_0^2 + Y_2^2 + Y_3^2 = 0 \tag{2}$$

$$k = \frac{P_2}{P_3} = -\left(\frac{Y_0}{Y_3}\right)^2 \tag{3}$$

where:
- k is the desired coupling coefficient
- $P_2$ is the power level applied at port 2
- $P_3$ is the power level applied at port 3
- $Y_0$ is the termination admittance at external ports 1-4 (not shown)

Rearranging equations (1)-(3) and solving for $Y_1$, $Y_2$ and $Y_3$ yields:

$$Y_2 = \pm jY_0 \sqrt{\frac{1+k}{k}} \tag{4}$$

$$Y_3 = \pm j \frac{Y_0}{\sqrt{k}} \tag{5}$$

$$Y_1 = -(Y_2 + Y_3) \tag{6}$$

where:
j is the complex coefficient

FIGS. 4a, 4b, 4c and 4d illustrate four specific embodiments of lumped element network 18 with passive elements. In equations (4) and (5), select the "+" sign for capacitors and "−" sign for inductors. Although equations (1)-(6) assume lossless components, a more precise model should take into account the dependency of the coupling coefficients, the attenuation constant and quality factors of each passive element. Such a detailed loss-oriented analysis is well known in the art.

Continuing with FIG. 3, lumped element network 50 (corresponding to directional coupler 10 of FIG. 1) includes admittance element 52 with value $Y_1$ coupled between port 2 at node 54 and power supply conductor 26. Admittance element 56 of value $Y_2$ is coupled between node 54 and node 58 while admittance element 60 of value $Y_1$ is coupled between node 58 and power supply conductor 26. Lumped element network 50 further includes admittance element 64 of value $Y_3$ coupled between node 54 and node 66, admittance element 68 of value $Y_2$ coupled between node 66 and node 70 and admittance element 74 of value $Y_3$ coupled between node 70 and node 58 at port 3. Admittance element 76 of values $Y_1$ is coupled between node 66 and power supply conductor 26, and admittance element 78 also of values $Y_1$ is coupled between node 70 and power supply conductor 26.

Lumped element network 80 (corresponding to transmission line 12 of FIG. 1) is also shown in FIG. 3 including inductor 82 of value $L_0$ coupled between nodes 36 and 66, and capacitors 84 and 86 each of value $C_0$ coupled between nodes 36 and 66 and power supply conductor 26, respectively. Lumped element network 88 (corresponding to transmission line 14 of FIG. 1) includes inductor 90 of value $L_0$ coupled between nodes 40 and 70, and capacitors 92 and 94 each of value $C_0$ coupled between nodes 40 and 70 and power supply conductor 26, respectively, as shown.

In applications using MMIC technology, the present invention including lumped elements 22-94 of FIGS. 3 and 4a-4d has advantages over the prior art since each passive element lends itself toward miniaturization much more readily than the distributed directional couplers 8-10 and strip-line transmission lines 12-14 of FIG. 1. Moreover, the passive components of directional filter 16 offer the desirable properties of a narrow filter bandwidth and high rejection between port 1 and port 4. Yet, directional filter 16 is quite general in nature containing 18 or more passive elements. It is possible to simplify directional filter 16 and achieve even smaller physical areas with fewer components.

Toward this goal, consider another prior art directional filter 100 shown in FIG. 5 which depends strictly on the length of the transmission lines. Primary transmission line 102 is coupled between port 1 and port 4 while primary transmission line 104 is coupled between port 2 and port 3. Transmission lines 106 and 108 are coupled between primary transmission lines 102 and 104 at an angle such that the distance between the coupling points of transmission lines 106 and 108 to primary transmission line 102 is ¼ wavelength of the center frequency of directional filter 100 ($\lambda_g/4$, where $\lambda_g$ is the wavelength of the center frequency). Similarly, the distance between the coupling points of transmission lines 106 and 108 to primary transmission line 104 is ¾ wavelength of the center frequency of directional filter 100 ($3\lambda_g/4$). transmission lines 106 and 108 operate as resonators open on both sides with lengths in multiples of ½ wavelength of the center frequency of directional filter 100 ($n\lambda_g/2$, where n is an integer value 1, 2, 3, etc.). The gap between transmission lines 106 and 108 and primary transmission lines 102 and 104 determines the degree of coupling therebetween. Directional filter 100 behaves as illustrated in FIG. 2 rejecting the center frequency component of the input signal from port 1 to port 4 while passing other frequency components, and passing the center frequency component of the input signal from port 1 to port 2 while rejecting others.

Figure 8A:
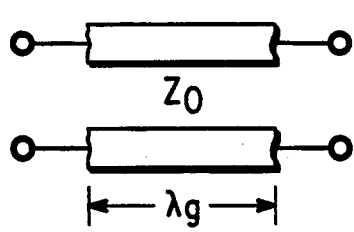
FIGS. 8a and 8b are block and schematic diagrams illustrating yet another conversion between full wavelength distributed and lumped element representations.

To convert the transmission line representation of directional filter 100 to lumped elements for MMIC applications, it is useful to work with the individual pieces thereof. In FIG. 6a, the ¼ wavelength of transmission line 102 from FIG. 5 may be represented in FIG. 6b as inductor 110 of value $L_0$ with capacitors 112 and 114 each of value $C_0$ coupled on either side of inductor 110 to power supply conductor 116. FIG. 6b is thus a passive lumped element representation of ¼ wavelength of transmission line 102. A similar conversion is shown in FIG. 7a and 7b wherein a ¾ wavelength of transmission line 104 from FIG. 7a is illustrated in FIG. 7b as lumped elements including capacitor 118 of value $C_0$ with inductors 120 and 122 each of value $L_0$ coupled on either side of capacitor 118 to power supply conductor 124. The coupling between primary transmission lines 102 and 104 and transmission lines 106 and 108 is represented as characteristic impedance $Z_0$. The values of inductors 110-122 are thus determined from $Z_0 = \omega_0 L_0$ and capacitors 112-118 from $1/Z_0 = \omega_0 C_0$, where $\omega_0$ is the center frequency. Furthermore in FIG. 8a, a full wavelength of transmission line 106 (n=2) is equivalent to serially coupled lumped element inductor 126 and capacitor 128 of value L and C, respectively, in FIG. 8b. The value of inductor 126 is determined by $L = \pi Z_0/\omega$ and capacitor 128 from $C = 1/\pi\omega Z_0$. Furthermore, the equivalency for wavelength long transmission lines 106 and 108 involves examining the distributed and lumped element representation behavior at resonance, wherein:

$$\omega_0 L_0 = \frac{1}{\omega_0 C_0} \tag{7}$$

$$\omega_0 L_0 = \omega Z_0 \tag{8}$$

Figure 8B:
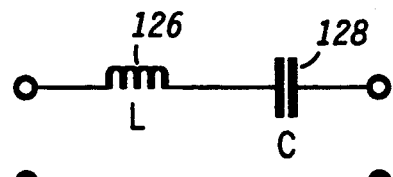
Figure 9:
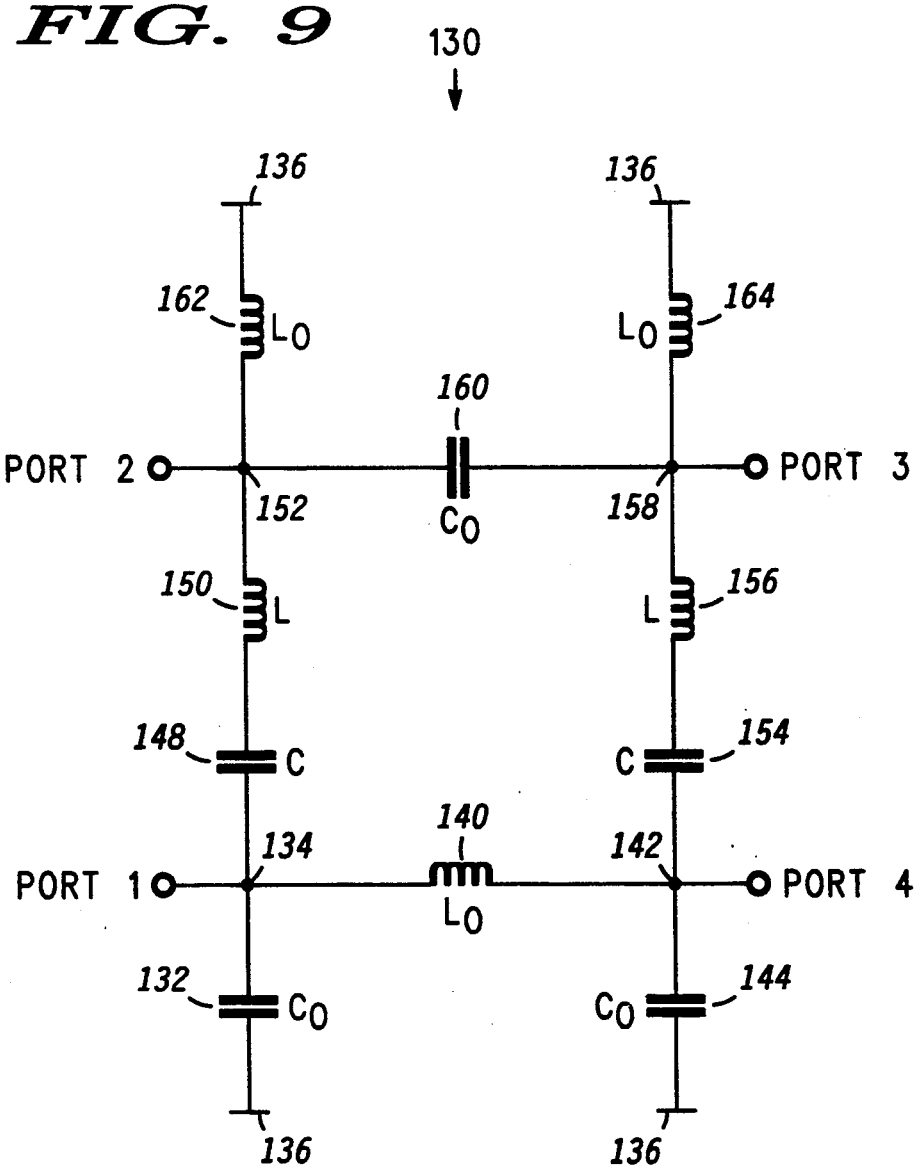
FIG. 9 is a schematic diagram illustrating a simplified four-port lumped element directional filter.

Thus, transmission lines 102-108 from FIG. 5 may be converted through the equivalent circuits shown in FIGS. 6b, 7b and 8b to lumped element directional filter 130 depicted in FIG. 9. Lumped element directional filter 130 includes capacitor 132 coupled between node 134 at port 1 and power supply conductor 136 operating at ground potential. Inductor 140 of value $L_0$ is coupled between node 134 and node 142 at port 4, while capacitor 144 of value $C_0$ is coupled between node 142 and power supply conductor 136. Capacitors 132 and 144 and inductor 140 come from lumped elements 110-114 of FIG. 6b. Directional filter 130 further includes capacitor 148 and inductor 150 of values C and L, respectively, coupled between node 134 and node 152 at port 2, and capacitor 154 and inductor 156 also of values C and L coupled between node 142 and node 158 at port 3. Capacitor 148 and inductor 150 come from lumped elements 126-128 of FIG. 8b. The same is true for capacitor 154 and inductor 156. Capacitor 160 of value $C_0$ is coupled between node 152 and node 158, while inductors 162 and 164 each of value $L_0$ are coupled between node 152 and node 158 and power supply conductor 136, respectively, as shown. Capacitor 160 and inductors 162 and 164 come from lumped elements 118-122 of FIG. 7b.

Notice directional filter 130 uses only ten lumped elements whereas the more general embodiment of directional filter 16 uses eighteen lumped elements. Thus, an important advantage of the present invention is not only the elimination of transmission lines, but further a reduction in number of lumped elements and associated decrease in surface area when realizing the directional filter in MMIC technology. The simplification of the directional filter translates to improved yield and lower costs during manufacturing with increased reliability since there are fewer components subject to failure.

Figure 10:
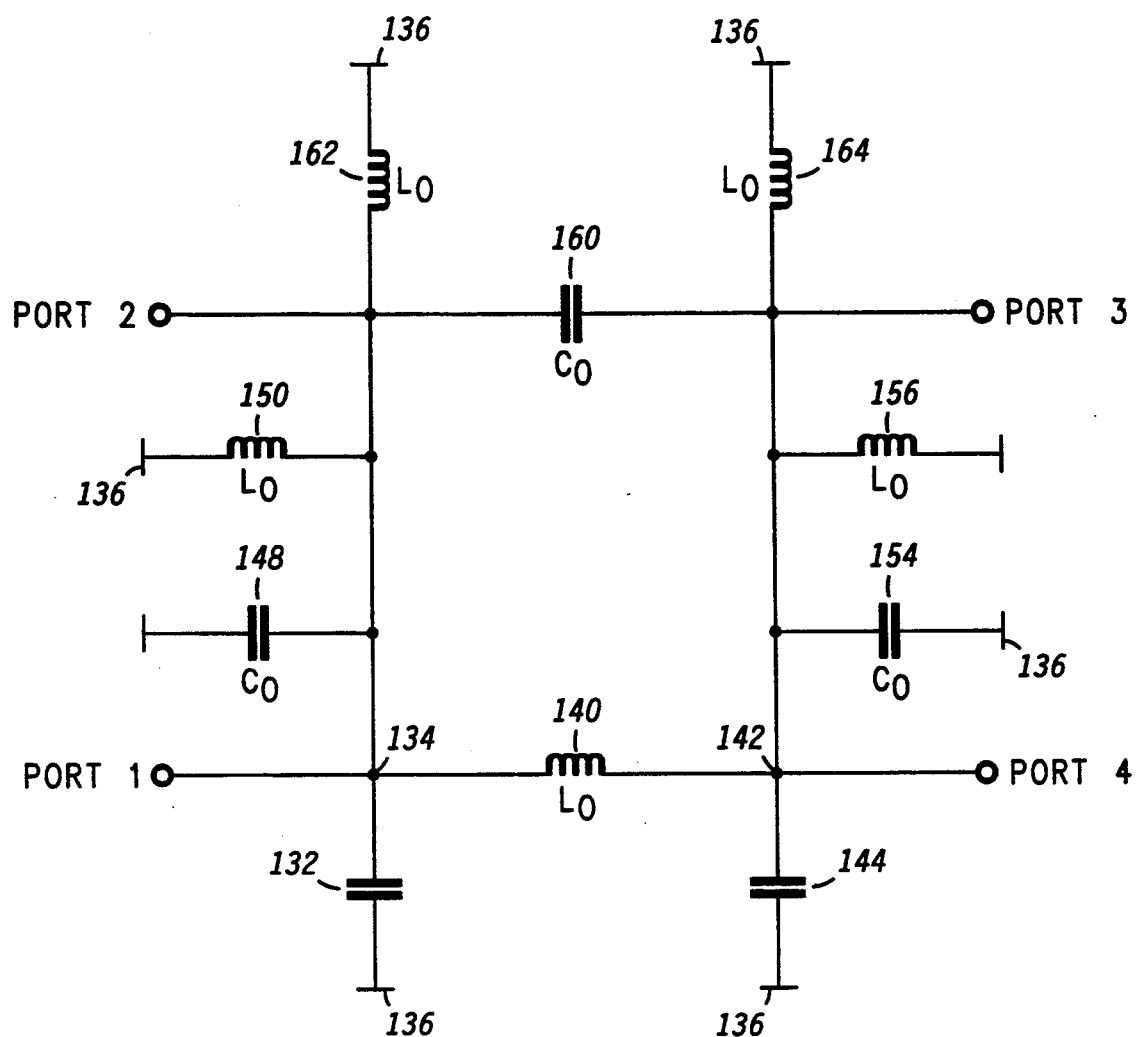
FIG. 10 is a schematic diagram illustrating an alternate embodiment of the simplified four-port lumped element directional filter.
Figure 11:
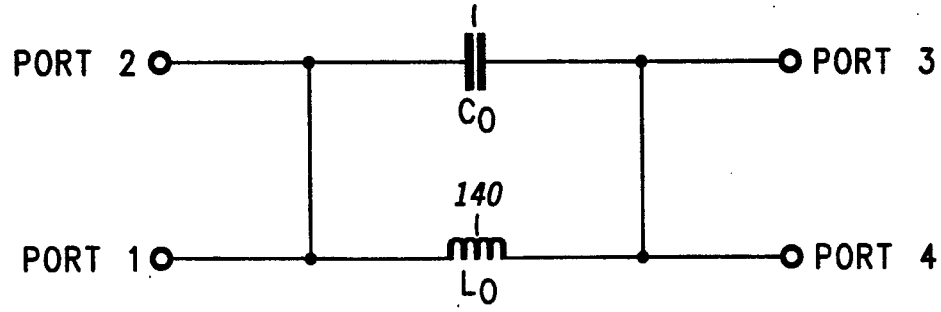
FIG. 11 is a schematic diagram illustrating a simplified two-element directional filter.

The embodiment of directional filter 130 offers flexibility in selection of filter bandwidth and rejection between port 1 and port 4 within the frequency band. Typically, a narrow filter bandwidth and high rejection are desirable. However, it is possible to simplify the lumped element directional filter even further if the particular application of interest allows a wider filter bandwidth and reduced rejection in the band. For such looser specifications, one must recognize that the series combination of capacitor 148 and inductor 150 and capacitor 154 and inductor 156 may also be connected as a shunt resonator as shown in FIG. 10. Otherwise, directional filter 168 of FIG. 10 has the same reference numbers used in FIG. 9. Capacitors 148 and 154 now take on values $C_0$ while inductors 150 and 156 each have value $L_0$. Now by selecting proper filter center frequency with values $C_0$ of capacitors 132, 148, 144 and 154 and $L_0$ of inductors 150, 156, 162 and 164 from equations (7) and (8), it is possible to resonate out the effects of the shunt elements to ground (132, 144-156, 162-164) thereby realizing directional filter 170 in FIG. 11 having inductor 140 coupled between port 1 and port 4 and capacitor 160 is coupled between port 2 and port 3. Such a simple directional filter offers great advantages in reduced surface area and manufacturing cost although it may provide wider filter bandwidth and less rejection from port 1 to port 4 than the embodiments of FIGS. 3 and 9.

Hence, what has been provided is a novel directional filter implemented with passive lumped elements in several embodiments from a general 18-element network, to an intermediate 10-element embodiment and to a simple two-element filter each with features and advantages depending on the application. In general, a directional filter with lumped elements require less physical area with similar performance characteristics as conventional transmission lines which is desirable in technologies such as MMIC.

We claim:

1. A directional filter having first, second, third and fourth ports, consisting essentially of:

an inductor connected between the first port and the fourth port, the first port being directly connected to the second port; and a capacitor connected between the second port and the third port for providing isolation between the first port and the third port and band rejection between the first port and the fourth port, the third port being directly connected to the fourth port.

2. A directional filter having first, second, third and fourth ports, comprising:

a first lumped element network coupled between the first port and the fourth port, said first lumped element network including,
(a) a first capacitor coupled between the first port and a power supply conductor,
(b) a first inductor coupled between the first port and the fourth port, and
(c) a second capacitor coupled between the fourth port and said power supply conductor, a second lumped element network coupled between the second port and the third port, said second lumped element network including,
(d) a second inductor coupled between the second port and said power supply conductor,
(e) a third capacitor coupled between the second port and the third port, and
(f) a third inductor coupled between the third port and said power supply conductor;

a third lumped element network coupled between the first port and the second port, said third lumped element network including,
(g) a fourth capacitor, and
(h) a fourth inductor serially coupled with said fourth capacitor between the first port and the second port; and a fourth lumped element network coupled between the third port and the fourth port for providing isolation between the first port and the third port and band rejection between the first port and the fourth port, said fourth lumped element network including,
(i) a fifth capacitor, and
(j) a fifth inductor serially coupled with said fifth capacitor between the third port and the fourth port.

3. In a MMIC device a directional filter having first, second, third and fourth ports, comprising:

a first lumped element network coupled between the first port and the fourth port, said first lumped element network including,
(a) a first passive element coupled between the first port and a power supply conductor,
(b) a second passive element coupled between the first port and the fourth port,
(c) a third passive element coupled between the fourth port and said power supply conductor
(d) a fourth passive element coupled between the first port and a first node,
(e) a fifth passive element coupled between the fourth port and a second node,
(f) a sixth passive element coupled between said first node and said second node,
(g) a seventh passive element coupled between said first node and said power supply conductor, and
(h) an eighth passive element coupled between said second node and said power supply conductor;

a second lumped element network coupled between the second port and the third port;

a third lumped element network coupled between the first port and the second port; and a fourth lumped element network coupled between the third port and the fourth port for providing isolation between the first port and the third port and band rejection between the first port and the fourth port.

4. The directional filter of claim 3 wherein said second lumped element network includes:
a ninth passive element coupled between the second port and said power supply conductor;
a tenth passive element coupled between the second port and the third port; and
an eleventh passive element coupled between the third port and said power supply conductor.

5. The directional filter of claim 4 wherein said second lumped element network further includes:
a twelfth passive element coupled between the second port and a third node;
a thirteenth passive element coupled between the third port and a fourth node;
a fourteenth passive element coupled between said third node and said fourth node;
a fifteenth passive element coupled between said third node and said power supply conductor; and
a sixteenth passive element coupled between said fourth node and said power supply conductor.

6. The directional filter of claim 5 wherein said third lumped element network includes:
a first capacitor coupled between said first node and said power supply conductor;
a first inductor coupled between said first node and said third node; and
a second capacitor coupled between said third node and said power supply conductor.

7. The directional filter of claim 6 wherein said fourth lumped element network includes:
a third capacitor coupled between said second node and said power supply conductor;
a second inductor coupled between said second node and said fourth node; and
a fourth capacitor coupled between said fourth node and said power supply conductor.

8. A directional filter having first, second, third and fourth ports, comprising:

a first lumped element network coupled between the first port and the fourth port, said first lumped element network including,
(a) a first capacitor coupled between the first port and a power supply conductor,
(b) a first inductor coupled between the first port and the fourth port, and
(c) a second capacitor coupled between the fourth port and said power supply conductor;

a second lumped element network coupled between the second port and the third port, said second lumped element network including,
(d) a second inductor coupled between the second port and said power supply conductor,
(e) a third capacitor coupled between the second port and the third port, and
(f) a third inductor coupled between the third port and said power supply conductor;

a third lumped element network coupled between the first port and the second port, said third lumped element network including,
(g) a fourth capacitor coupled between the first port and said power supply conductor, and (h) a fourth inductor coupled between the first port and said power supply conductor, the first port being coupled to the second port, and a fourth jumped element network coupled between the third port and the fourth port for providing isolation between the first port and the third port and band rejection between the first port and the fourth pot, said fourth lumped element network including, (i) a fifth capacitor coupled between the fourth port and said power supply conductor, and (j) a fifth inductor coupled between the fourth port and said power supply conductor, the third port being coupled to the fourth port.

* * * * *

UNITED STATES PATENT AND TRADEMARK OFFICE
CERTIFICATE OF CORRECTION

PATENT NO. : 5,124,674
DATED : June 23, 1992
INVENTOR(S) : Michael Dydyk and Vijay Nair It is certified that error appears in the above-identified patent and that said Letters Patent is hereby corrected as shown below:

In column 9, line 4, claim 8, please delete the word "jumped" and insert the word --lumped--.

In column 10, line 1, claim 8, please delete the word "pot" and insert the word --port--.

Signed and Sealed this

Twelfth Day of October, 1993

*Attest:*

BRUCE LEHMAN

*Attesting Officer*      *Commissioner of Patents and Trademarks*